(12) United States Patent
Bureau et al.

(10) Patent No.: US 10,636,763 B2
(45) Date of Patent: *Apr. 28, 2020

(54) ENHANCED CLEANING FOR WATER-SOLUBLE FLUX SOLDERING

(71) Applicant: International Business Machines Corporation, Armonk, NY (US)

(72) Inventors: Charles C. Bureau, Bromont (CA); Eric Duchesne, Granby (CA); Kang-Wook Lee, Yorktown Heights, NY (US); Isabelle Paquin, Bromont (CA); Dragoljub Veljanovic, Granby (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/705,311

(22) Filed: Sep. 15, 2017

(65) Prior Publication Data
US 2018/0005975 A1    Jan. 4, 2018

Related U.S. Application Data

(63) Continuation of application No. 15/052,461, filed on Feb. 24, 2016, now Pat. No. 9,818,717.

(51) Int. Cl.
*H01L 23/00* (2006.01)
*B23K 1/20* (2006.01)
(Continued)

(52) U.S. Cl.
CPC .......... *H01L 24/81* (2013.01); *B23K 1/0016* (2013.01); *B23K 1/203* (2013.01); *B23K 35/262* (2013.01);
(Continued)

(58) Field of Classification Search
CPC .......... H01L 2224/13111; H01L 24/81; H01L 2924/014; H01L 2924/0105;
(Continued)

(56) References Cited

U.S. PATENT DOCUMENTS 4,994,119 A * 2/1991 Gutierrez ........... B23K 35/3613
148/23
5,150,832 A * 9/1992 Degani .................. B23K 35/36
148/24

(Continued)

OTHER PUBLICATIONS

Bivins et al., "Cleaning of Lead-Free Solder Paste Residues", A Guiding Influence in the Electronics Industry, This paper was downloaded from the SMART Group web site at www.smartgroup.org on Nov. 20, 2015, 11 pages.

(Continued)

*Primary Examiner* — Joseph M Galvin, III
(74) *Attorney, Agent, or Firm* — Alexander G. Jochym

(57) ABSTRACT

An approach to provide an electronic assembly process that includes receiving at least one electronic assembly after a solder reflow process using a Sn-containing solder and a water-soluble flux. The approach includes baking the at least one electronic assembly in an oxygen containing environment and, then cleaning the at least one electronic assembly in an aqueous cleaning process.

18 Claims, 2 Drawing Sheets

(51) Int. Cl.
| | |
|---|---|
| *B23K 35/36* | (2006.01) |
| *B23K 1/00* | (2006.01) |
| *C23G 1/00* | (2006.01) |
| *B23K 35/26* | (2006.01) |
| *B23K 35/362* | (2006.01) |
| *C21D 9/50* | (2006.01) |
| *C23G 5/00* | (2006.01) |
| *B23K 101/42* | (2006.01) |

(52) U.S. Cl.
CPC .......... *B23K 35/36* (2013.01); *B23K 35/362* (2013.01); *B23K 35/3618* (2013.01); *C21D 9/50* (2013.01); *C23G 1/00* (2013.01); *C23G 5/00* (2013.01); *B23K 2101/42* (2018.08); *H01L 2224/1145* (2013.01); *H01L 2224/1146* (2013.01); *H01L 2224/13111* (2013.01); *H01L 2224/16227* (2013.01); *H01L 2224/81011* (2013.01); *H01L 2224/81024* (2013.01); *H01L 2224/8191* (2013.01); *H01L 2224/81815* (2013.01); *H01L 2224/81911* (2013.01); *H01L 2224/81948* (2013.01)

(58) Field of Classification Search
CPC . H01L 2224/11849; H01L 2224/81815; H01L 2224/0401; H01L 2224/13611; H01L 24/14; H01L 2224/03828; H01L 2224/0381; H01L 2224/9212; H01L 2224/1181; H01L 2224/03849; H01L 2224/11848; H01L 2224/81948; H01L 2224/8191; H01L 2224/81024; B23K 1/203; B23K 1/0016; B23K 35/3618; B23K 35/362; H05K 13/0465; H05K 3/34; H05K 2203/04; H05K 2203/12
See application file for complete search history.

(56) References Cited

U.S. PATENT DOCUMENTS

| | | | | |
|---|---|---|---|---|
| 5,255,839 | A * | 10/1993 | da Costa Alves | ... B23K 1/0016 228/180.21 |
| 5,264,046 | A * | 11/1993 | Winston | .................. C23G 1/20 134/2 |
| 5,558,109 | A | 9/1996 | Cala et al. | |
| 5,833,758 | A | 11/1998 | Linn | |
| 5,888,308 | A * | 3/1999 | Sachdev | .................. B41N 3/06 134/1 |
| 5,938,865 | A | 8/1999 | Kondo et al. | |
| 5,958,144 | A * | 9/1999 | Cala | ...................... C11D 1/004 134/2 |
| 6,127,735 | A | 10/2000 | Berger et al. | |
| 6,503,874 | B2 | 1/2003 | Sachdev et al. | |
| 6,511,546 | B1 * | 1/2003 | Bivins | .................. C11D 1/008 134/2 |
| 6,716,290 | B1 | 4/2004 | Rosser et al. | |
| 6,722,557 | B2 | 4/2004 | Tanaka | |
| 7,767,032 | B2 | 8/2010 | Sheng | |
| 8,877,697 | B2 | 11/2014 | Tanaka et al. | |
| 9,818,717 | B2 * | 11/2017 | Bureau | .................. H01L 24/81 |
| 2002/0092895 | A1 * | 7/2002 | Blackshear | .......... B23K 35/001 228/226 |
| 2005/0067468 | A1 * | 3/2005 | Lu | .......................... B23K 1/203 228/207 |
| 2006/0237032 | A1 | 10/2006 | Cheng | |
| 2011/0115084 | A1 | 5/2011 | Ueshima | |
| 2012/0090646 | A1 * | 4/2012 | Tanaka | ................... C11D 7/263 134/26 |
| 2012/0231633 | A1 * | 9/2012 | Ewert | ................... C23C 14/541 438/763 |
| 2018/0005975 | A1 * | 1/2018 | Bureau | ................... H01L 24/17 |

OTHER PUBLICATIONS

Batzill et al., "The surface and materials science of tin oxide", Progress in Surface Science, 2005, pp. 47-154.
Bossert, "Introduction to Organotin Chemistry and Applications", Gelest, Inc., printed on Feb. 16, 2016, pp. 284-289.
Chandrasekhar et al., "Synthesis and X-ray Crystal Structure of the Novel Organotin Dication [n-Bu2Sn(H2O)4]2+: A Lamellar Layered Structure Assisted by Intermolecular Hydrogen Bonding", Received Jul. 23, 2002, Organometallics, 2002, pp. 4575-4577.
Garcia et al., "The Structural and Electronic Properties of Tin Oxide Nanowires: An Ab Initio Investigation", The Journal of Physical Chemistry, 2012 American Chemical Society, pp. 13382-13387, Published on Jun. 4, 2012, <dx.doi.org/10.1021/jp300793e>.
Howie et al., "Crystal Data and Formula for Hydrous Tin(II) Oxide: A Note", American Mineralogist, vol. 58, p. 552, 1973.
Honnick et al., "Tin(II) Hydroxide", Inorganic Chemistry, vol. 15, No. 12, 1976, pp. 3034-3037.
Hussain et al., "Synthesis and structural characterization of organotin(IV) complexes formed with [O,O] donor atoms of carboxylic acids", Journal of the Serbian Chemical Society, 73(2), pp. 179-187 (2008).
Pan, "Chemical Vapor Deposition of One Dimensional Tin Oxide Nanostructures: Structural Studies, Surface Modifications and Device Applications", Dissertation, 2010, 231 pages.
Salehi et al., "Electronic and Structural Properties of Tin Dioxide in Cubic Phase*", Iranian Journal of Science & Technology, Transaction A, vol. 34, No. A2, final revised form Oct. 6, 2010, pp. 131-138.
Smart et al., "Molecular structure of tin(II) acetate as determined in the gas phase by electron diffraction and ab initio calculations", J. Chem. Soc. Dalton Trans., Published on Jan. 1, 1997, pp. 1565-1569.
"White Residue and Water Soluble Fluxes", Technical Services Laboratory, Alpha-Fry Technologies, downloaded on Nov. 20, 2015, 3 pages.
Yin et al., "One-dimensional Infinite chain organotin complexes: Synthesis and structural characterization of triphenyltin(IV) thiophen-2-carboxylate and triphenyltin(IV) 4-pyridinlcarboxylate", Indian Journal of Chemistry, vol. 42A, Jan. 2003, Received Oct. 13, 2001, revised Sep. 3, 2002, pp. 48-52.
U.S. Appl. No. 15/052,461, filed Feb. 24, 2016.
Appendix P: List of IBM Patents or Patent Applications Treated as Related, filed Sep. 15, 2017, pp. 1-2.

* cited by examiner

EXAMPLE OF A CHART DEPICTING A NUMBER OF MODULES OBSERVED WITHOUT Sn-CONTAINING CRYSTALS OUT OF A TOTAL NUMBER OF MODULES EXAMINED FOR VARIOUS PSRB PROCESSES BAKE TEMPERATURES AND BAKE TIMES

| BAKE TIME (MIN) | TEMPERATURE (°C) | | | | | | | |
|---|---|---|---|---|---|---|---|---|
| | 50 | 60 | 70 | 80 | 85 | 100 | 110 | 120 |
| 15 | | | | | | 4/4 | | |
| 25 | | | | 4/4 | | | | |
| 30 | | | | | | 0/4 | | |
| 40 | | | | | | 1/45 | | |
| 60 | | | 1/3 | | 0/4 | 0/45 | | |
| 70 | | | | | | | 0/118 | |
| 90 | | | | | | | 0/42 | 0/25 |
| 120 | 2/4 | 1/20 | 0/3 | | | | | |
| 180 | | 0/14 | | | | | | 0/7 |

ENHANCED CLEANING FOR WATER-SOLUBLE FLUX SOLDERING

BACKGROUND OF THE INVENTION

The present invention relates generally to the field of semiconductor packaging processes and more particularly to cleaning processes for water-soluble fluxes used in soldering of flip chip semiconductor packaging and other electronic packages.

In the manufacture of integrated circuits, there is a continuing drive to fit more semiconductor devices and circuits in semiconductor wafers and electronic packaging assemblies, thus, driving denser, more complex semiconductor packages such as flip chip semiconductor modules and ball grid array (BGA) modules providing dense interconnection capability. The assembly of flip chip semiconductor devices and BGA modules in electronic packaging commonly involves the use of soldering processes. Fluxes play an important role is effective soldering processes by removing surface oxides from solder and metal pad surfaces to enable effective interconnection or solder joint formation during solder reflow.

Environmental concerns with previously used flux chemistries, such as rosin based fluxes or other fluxes that were cleaned after soldering using halogenated hydrocarbons or fluorocarbons, have driven the use of fluxes with a chemistry that is compatible with aqueous cleaning processes or mild, no clean fluxes that leave a non-conductive flux residue. Water-soluble fluxes generally provide a higher activity than no clean fluxes and are required for some electronic assembly processes. Water-soluble fluxes are typically composed of one or more activators to remove surface oxides, solvents to aid in deploying flux to the solder joint area, high temperature resistant chemicals, or vehicles that act as oxygen barriers and other additives (e.g., surfactants, thickeners, etc.). Water-soluble flux residues, if left after aqueous cleaning, may cause delamination of underfill from chip or substrate, and therefore, in most cases, it is desirable that water-soluble flux residues are removed after solder reflow and assembly processes.

SUMMARY

Embodiments of the present invention provide a method for an electronic assembly process that includes receiving at least one electronic assembly after a solder reflow process using a Sn-containing solder and a water-soluble flux. The method includes baking the at least one electronic assembly in an oxygen containing environment and, then cleaning the at least one electronic assembly in an aqueous cleaning process.

DETAILED DESCRIPTION

Figure 1:
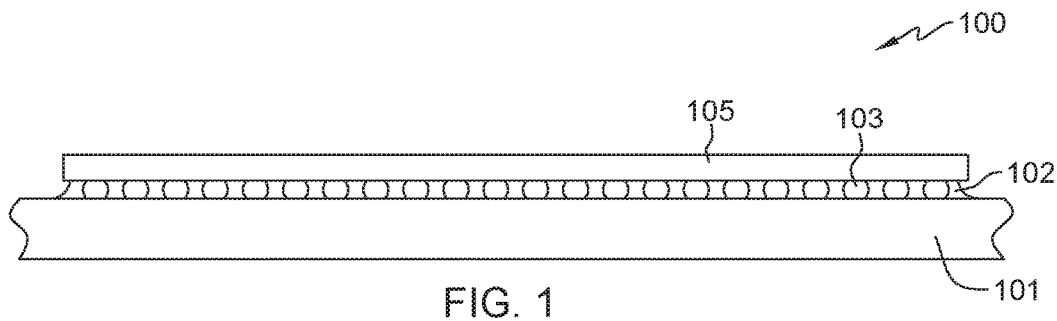
FIG. 1 depicts a cross-section of a flip chip semiconductor module prior to aqueous cleaning in accordance with an embodiment of the present invention.

Detailed embodiments of the claimed structures and methods are disclosed herein. The method steps described below do not form a complete process flow for manufacturing semiconductor modules. The present embodiments can be practiced in conjunction with the semiconductor packaging fabrication techniques and electronic packaging assembly techniques currently used in the art, and only so much of the commonly practiced process steps are included as are necessary for an understanding of the described embodiments. The Figures represent cross-section portions of a semiconductor module or a semiconductor package during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing Figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating, or layers at the interface of the two elements.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be described. It should be understood that the following description is rather focused on the distinctive features or elements of the various embodiments of the present invention.

Embodiments of the present invention recognize that water-soluble flux cleaning processes may leave a flux residue, particularly in the case of lead-free flip chip assembly processes with high-density interconnections. High-density interconnections provide less space for aqueous cleaning solution entry and exit for flux removal after solder reflow. Additionally, embodiments of the present invention recognize that common practices in industry may include solder reflow and bake of semiconductor packages and other electronic packaging assemblies in nitrogen to avoid or reduce metal oxidation during solder reflow or bake. Furthermore, embodiments of the present invention recognize that it is common practice in industry to minimize the time between solder reflow and a cleaning process to improve cleaning effectiveness and flux residue removal.

Embodiments of the present invention propose an addition of a post solder reflow bake process in an oxygen-containing environment prior to an aqueous cleaning operation for electronic package assemblies and semiconductor modules manufactured using a Sn-containing solder and a water-soluble flux. Embodiments of the present invention include a range of bake temperatures and bake times for the post solder reflow bake (PSRB) process to improve the effectiveness of an aqueous cleaning process in removing unwanted flux residues. Embodiments of the present invention propose that the PSRB process in an oxygen-containing environment is performed after solder reflow and prior to an aqueous cleaning operation to reduce or eliminate undesirable flux residues, and in particular, to eliminate the formation of Sn-containing crystal formed from water-soluble flux residues after aqueous cleaning.

As is known to one skilled in the art, fluxes can play an important role in soldering operations and particularly in flip chip joining for advanced semiconductor modules. As semiconductor chip size and I/O density for interconnects increase, the challenges for fluxes in forming acceptable solder joints during the solder reflow process may include an avoidance of post-soldering defect formation such as solder pad non-wets, post-solidification deformations (PSDs), and micro-solder balls, for example. The use of stronger, more active fluxes such as water-soluble fluxes in high density advanced semiconductor packages including flip chip semiconductor devices, ball grid array (BGA) packages, and high density PCB assemblies with BGA packages or other large, densely configured I/O packages may reduce the occurrences of post-soldering defects. While improving yields by reducing the occurrence of post-soldering defects during assembly and reflow processes, various water-soluble fluxes may leave flux residues that in some cases cannot be removed in typical aqueous cleaning operations.

While the discussion of embodiments of the present invention focuses on flip chip semiconductor device assembly processes, the method and processes discussed are not limited to flip chip semiconductor device assembly processes but can be applied to other water-soluble flux electronic assembly processes using a Sn-containing solder. For example, a PSRB process can be added to BGA module assembly processes using water-soluble fluxes or to any printed circuit board (PCB) assembly process using a water-soluble flux with a Sn-containing solder and an aqueous cleaning process. In various embodiments, a PSRB process is used in any suitable electronic packaging assembly process with one or more Sn-containing solders and a water-soluble flux after solder reflow and prior to aqueous cleaning to prevent the formation of Sn-containing crystals, which are difficult to remove with an aqueous cleaning process.

FIG. 1 depicts a cross-section of a flip chip semiconductor module 100 prior to solder reflow in accordance with an embodiment of the present invention. As depicted, FIG. 1 includes module substrate 101, water-soluble flux 102, solder interconnect 103, and flip chip semiconductor device 105. In various embodiments, module substrate 101 is any module substrate capable of supporting a solder interconnection to a flip chip semiconductor device. For example, module substrate 101 can be a laminate substrate, a ceramic substrate, a semiconductor substrate such as silicon, or other module substrate material used to attach a flip chip semiconductor device using a Sn-containing solder such as a lead-free solder. In some embodiments, module substrate 101 is a multichip module substrate capable of having more than one semiconductor device attached as in a multichip module (MCM). In various embodiments, module substrate 101 attaches to another level of electronic packaging (not shown in FIG. 1). For example, module substrate 101 can be attached to a PCB by an interconnection such as a solder ball (e.g., a BGA module), a pin, a leadframe, a lead, or other type of interconnection not shown in FIG. 1.

In various embodiments, water-soluble flux 102 can be any suitable water-soluble flux for flip chip semiconductor device attached with a soldering process to a module substrate. For example, a water-soluble flux can be composed of at least one or more of the following components including an activator, a solvent, a vehicle, and additives. Activators for a water-soluble flux include but are not limited to diacids such as oxalic acid, malonic acid, or glutaric acids, and multiacids such as diethylenetriamine pentaacetic acid, tricarballylic acid, or butanentetracarboxylic acid. Examples of solvents for water-soluble flux include but, are not limited to isopropyl alcohol, glycol ethers, glycerol ethoxylates, alkyl diols, and epoxy resins. In other embodiments, water-soluble flux 102 is a flux in another electronic packaging assembly such as a BGA module assembly or a PCB assembly. In an embodiment, water-soluble flux 102 is a set of one or more fluxes that includes Indium® WS-3555. Water-soluble flux 102 can be a flux applied to either or both of module substrate 101 or flip chip semiconductor device 105.

Solder interconnect 103 can be any suitable Sn-containing solder interconnection formed during a solder reflow process with a water-soluble flux. For example, solder interconnect 103 can be formed from a reflowed plated solder bump, a reflowed solder ball, a reflowed screened solder paste, a solder bump deposited by evaporation or other similar process on flip chip semiconductor device 105 or module substrate 101. In various embodiments, solder interconnect 103 is formed from any Sn-containing solder. Examples of one or more Sn-containing solders used to create solder interconnect 103 during a solder operation that may use a PSRB process include lead-free solder compositions, Sn—Pb solders, other lead-containing Sn-based solders, and any other Sn-containing solder for an electronic packaging assembly. In some embodiments, solder interconnect 103 is a lead-free flip chip solder interconnection joining module substrate 101 to flip chip semiconductor device 105.

Figure 2:
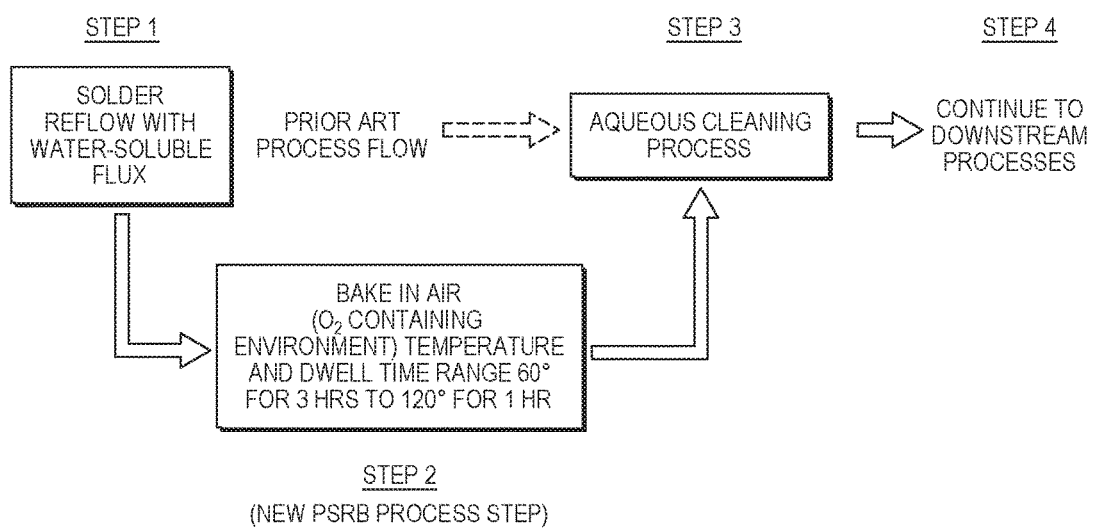
FIG. 2 depicts a portion of an assembly process flow for a flip chip semiconductor module using a post solder reflow bake (PSRB) in accordance with an embodiment of the present invention.

FIG. 2 depicts a portion of an assembly process flow 200 for flip chip semiconductor module 100 using a PSRB process in accordance with an embodiment of the present invention. In addition to depicting an assembly process flow that includes a PSRB process (Step 2) according to embodiments of the present invention, FIG. 2 includes a conventional or known prior art process flow for a portion of a semiconductor module assembly process for a flip chip device attachment. The prior art process flow depicted in FIG. 2 includes an assembly process flow depicted as Step 1 (solder reflow process) followed by Step 3 (aqueous cleaning process) and then, continues on to Step 4 which is the continuation to other downstream processes such as encapsulation, inspection, or test depending on the specific manufacturing process flow for a module or a PCB assembly. As known to one skilled in the art, a goal in most traditional or prior art assembly process flows completed in manufacturing may be to minimize the time that occurs between Step 1 and Step 3 to improve the effectiveness of an aqueous cleaning process (Step 3) by reducing flux residue residence time in the assembled module.

In various embodiments, as depicted in FIG. 2, an assembly process flow for flip chip semiconductor device 105 attached to module substrate 101 using a Sn-containing solder for solder interconnect 103 and water-soluble flux 102 includes a PSRB process (Step 2). As depicted in FIG. 2, the assembly process flow for various embodiments of the present invention begins with Step 1 (solder reflow process) followed by Step 2, a PSRB process (i.e, a bake in air or other oxygen containing environment) then, proceeding to Step 3 (aqueous cleaning process), and on to Step 4 (the continuation to downstream processes). In various embodiments, the addition of Step 2, a PSRB process reduces or eliminates the formation of Sn-containing crystals in the assembled module after the Step 3 aqueous cleaning process. As discussed in detail below, the addition of a treatment such as a PSRB process in air to the assembly process flow for a flip chip semiconductor module using a Sn-containing lead free solder and a water soluble flux oxidizes undesirable Sn(II) carboxylate flux residues present after solder reflow to prevent the formation of difficult to remove Sn-containing crystals formed by hydrolysis during a post soldering aqueous cleaning process. In the following discussions of Sn-containing carboxylate flux residues, II and IV in Sn(II) and Sn(IV) represent the oxidation states of Sn as +2 and +4, respectively. A more detailed description of each step in the assembly process flow in FIG. 2 is included below.

Step 1 is a solder reflow process for a Sn-containing solder using a water-soluble flux as known to one skilled in the art. In various embodiments, the solder reflow process is for a lead-free solder used in a flip chip semiconductor module but is not limited to a flip chip semiconductor reflow process. The lead-free solder may be any lead-free solder containing Sn that is compatible with a flip chip semiconductor module assembly process. For example, a lead-free solder may be a 98% Sn 1.4% Ag 0.6% Cu with solder reflow peak temperatures in the range of 220 degree Celsius to 270 degree Celsius. Other examples of a lead-free solder that can be utilized in the PSRB process include but, are not limited to various compositional ranges of Sn—Ag based solders, Sn—Ag—Cu based solders, Sn—Zn based solders, Sn—Sb based solders of various compositional ranges, any other lead-free solder that includes Sn, and any of the lead-free solders above that include an the addition of one or more additional elements. In other embodiments, the solder reflow process with a water-soluble flux in Step 1 occurs using a lead based solder (e.g., Sn—Pb).

In Step 1, various water-soluble fluxes used in the solder reflow process may leave Sn-containing flux residue in addition to other organic and inorganic flux residue after solder reflow. Sn-containing flux residue may be observed as black dots that may be embedded in a viscous organic flux residue after solder reflow. Many typical water-soluble fluxes include one or more activators that may be activators (R—(COOH)n) where R is an alkyl group or an alkyl-containing group. During Step 1 (solder reflow process) the activators react with various Sn oxides (SnO and $SnO_2$) present on solder pads or created at the molten reflowed solder surface yielding $R(COO)_2Sn(II)$ and $R(COO)_4Sn(IV)$ respectively. By-products or Sn-containing flux residues of the solder reflow process depicted in Step 1 for a solder process using a water-soluble flux include a Sn(II) carboxylate, R—$(COO)_2$Sn(II), and a Sn(IV) carboxylate, R—$(COO)_4$Sn(IV).

Figures 3A, 3B:
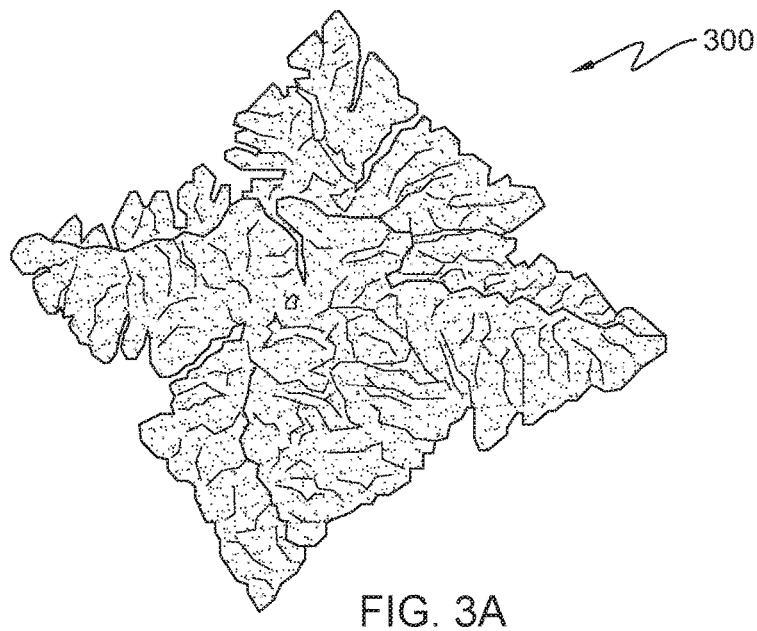
FIG. 3A depicts an example of a Sn-containing crystal formed from water-soluble flux residues after an aqueous clean in accordance with an embodiment of the present invention.
FIG. 3B is an example of a chart depicting the results of a post-aqueous clean semiconductor module inspection for Sn-containing crystals in accordance with an embodiment of the present invention in accordance with an embodiment of the present invention.

As previously discussed, in the prior art process flow or a standard known assembly processes depicted in FIG. 2, Step 3, an aqueous cleaning process follows Step 1, the solder reflow process with water-soluble flux. In this case according to known scientific processes, a Sn(II) carboxylate flux residue (i.e., R—$(COO)_2$Sn(II)) yielded during Step 1 can form a cauliflower-like Sn-containing crystal as depicted in FIG. 3A during the next prior art step, Step 3 (aqueous cleaning process) upon hydrolysis. Based on scientific literature, the cauliflower-like Sn-containing crystals have a composition of either $[Sn_3(OH)_4]^{2+}$ or $Sn_6O_4(OH)_4$ as illustrated in the chemical equation below.

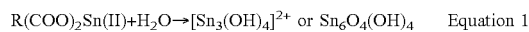
Equation 1

In Equation 1 above, the resulting compounds which may be either $[Sn_3(OH)_4]^{2+}$ or $Sn_6O_4(OH)_4$ can crystallize in an aqueous solution. The Sn-containing crystals created using the prior art process flow can be observed on the surface of the semiconductor device or on the laminate module substrate surface after Step 3, the aqueous cleaning process, and they are undesirable in an assembled module. The cauliflower-like Sn-containing crystals formed from Sn(II) carboxylates (water-soluble flux residues) after aqueous cleaning may be present on either one or both of flip chip semiconductor device 105 and module substrate 101 surfaces when using the prior art process flow depicted in FIG. 2 and may not be removed with known aqueous cleaning processes in packed high density flip chip modules.

However, a Sn(IV) carboxylate flux residue also created in Step 1 does not crystallize easily upon its hydrolysis during the aqueous cleaning process in Step 3. A mixture of the Sn(IV) carboxylate flux residue and the subsequently hydrolyzed by-products can be removed from the flip chip semiconductor module using known aqueous cleaning processes. The hydrolysis of a Sn(IV) carboxylate occurs according to the chemical equation below, Equation 2, where the formed Sn(IV)hydroxides are in a non-crystal form that dissolves in water and thus, are removed during aqueous cleaning.

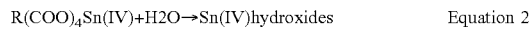
Equation 2

After the completion of Step 1, a solder reflow process, in accordance with embodiments of the present invention depicted in FIG. 2, a PSRB process (Step 2) is added to the assembly process flow as a post solder reflow bake in air or another oxygen-containing environment. A PSRB process is performed prior to the aqueous cleaning process (Step 3). A PSRB process (Step 2) is a bake process in air that may be performed over a range of temperatures and a corresponding range of bake times. A PSRB process of Step 2 is a method of oxidizing the Sn(II) component of the water-soluble flux residues, in particular Sn(II) carboxylate flux residues prior to cleaning (Step 3) the reflowed semiconductor module in water. According to the chemical equation below, Equation 3, during a PSRB process, the Sn(II) carboxylate flux residues can react with oxygen in air to yield benign or non-crystallizing Sn(IV) carboxylate flux residues.

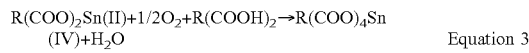
Equation 3

By oxidizing Sn(II) carboxylate flux residue into Sn(IV) carboxylate flux residue using the PSRB process of Step 2, the various embodiments of the present invention provide a method to prevent the formation of undesirable cauliflower-like Sn-containing crystals (e.g., created by the hydrolysis of Sn(II) carboxylates during the aqueous cleaning process (Step 3). With the addition of a PSRB process in Step 2, the assembly process flow of FIG. 2 transforms or oxidizes the Sn(II) carboxylates into Sn(IV) carboxylates prior to aqueous cleaning and creates R—(COO)$_4$Sn(IV) flux residues that, upon hydrolysis, do not yield insoluble crystals or adhere to the semiconductor device surface and module substrate surface (e.g., a laminate surface). Without crystallization on the semiconductor device or on the laminate substrate surface, the Sn-containing flux residue created by hydrolysis of the Sn(IV) carboxylates during the aqueous cleaning process (Step 3) may be successfully removed from the semiconductor module assembly (e.g., a flip chip semiconductor module) using known aqueous cleaning processes. In other embodiments, the PSRB process is performed before an aqueous cleaning process (Step 3) for any electronic packaging assembly process such as a BGA module assembly process or a PCB assembly process.

Upon completion of Step 3 (aqueous cleaning process), the assembly process flow continues on to Step 4. Step 4 is the continuation of downstream processes such as module encapsulation, inspection, or test as determined by the type of module or electronic packaging assembly and the manufacturing process for the electronic packaging assembly.

FIG. 3A depicts an example of a Sn-containing crystal 300 formed from water-soluble flux residues after an aqueous clean in accordance with an embodiment of the present invention. FIG. 3A depicts one example of a cauliflower-like Sn-containing crystal. The Sn-containing crystal can be formed from Sn(II) carboxylates (water-soluble flux residues) after aqueous cleaning of an electronic packaging assembly assembled using a Sn-containing solder. In some embodiments, a PSRB process (Step 2 in FIG. 2) used with some water-soluble fluxes and an inadequate or too low bake temperature or a too short bake time may result in the creation of one or more Sn-containing crystals. A Sn-containing crystal, as depicted in FIG. 3A, may be formed from Sn(II) carboxylates (water-soluble flux residues) after aqueous cleaning of a flip chip module assembled using a Sn-containing solder. Sn-containing crystals may also be formed when the electronic assembly or semiconductor module is assembled with a Sn-containing solder and a water-soluble flux without a PSRB process. A Sn-containing crystal as depicted in FIG. 3A may be present on either or both of the semiconductor device and module substrate surfaces after an assembly flow process (e.g., FIG. 2). While FIG. 3A depicts an example of a Sn-containing crystal, as known to one skilled in the art, some variation may occur in the crystal structure of a Sn-containing crystal in other examples.

FIG. 3B is an example of a chart 350 depicting the results of a post-aqueous clean semiconductor module inspection for Sn-containing crystals in accordance with an embodiment of the present invention. FIG. 3B is a matrix of the results for a post water clean inspection of semiconductor modules assembled using assembly process flow 200 depicted in FIG. 2. The semiconductor modules inspected were assembled using a PSRB process that includes a range of bake temperatures combined with a range of bake times as depicted in the matrix of results in FIG. 3B. The matrix identifies the number of semiconductor modules observed with Sn-containing crystals on either the semiconductor device surface or the laminate module substrate surface after performing Step 1, Step 2, and Step 3 in FIG. 2. FIG. 3B depicts the results for the number of inspected semiconductor modules with one or more observed Sn-containing crystals after cleaning for a range of bake temperatures in degrees Celsius (X axis) and for a range of associated bake time in minutes (Y axis).

The results of the module inspection are represented in FIG. 3B as the number of semiconductor modules observed without Sn-containing crystals out of the total number of semiconductor modules inspected using various PSRB processes bake temperatures and bake times (e.g., 0/118 or zero semiconductor modules observed with Sn-containing crystals for 118 inspected semiconductor modules using a PSRB with a bake temperature of 110° Celsius and a bake time of 70 minutes). The inspection results are presented for a range of various bake temperatures (X axis) and a range of various bake times (Y axis). FIG. 3B illustrates that the addition of a PSRB process for a range of different combinations of temperature ranging from 60° C. to 120° C. and bake time ranging from 30 minutes to 180 minutes were effective in eliminating Sn-containing crystals after solder reflow, air bake (PSRB process), and a standard aqueous cleaning process.

While FIG. 3B depicts an example of post-aqueous clean semiconductor module inspection for Sn-containing crystals in semiconductor modules baked with a PSRB process using various bake temperatures and bake times, a PSRB process is not limited to the depicted bake temperatures and bake times. For example, a PSRB process may use higher temperatures than shown in FIG. 3B such as 180° Celsius or above and may use lower temperatures such as 40° Celsius. Additionally, the PSRB process may include shorter bake times such as fifteen minutes associated with higher temperatures (greater than 120° Celsius) or longer bake times greater than one hundred and eighty minutes (i.e., more than three hours) associated with lower temperatures (e.g., less than 60° Celsius).

In some embodiments, the flip chip semiconductor devices used by the embodiments of the present invention may be diced in semiconductor chip form or in diced semiconductor wafer form. The flip chip semiconductor devices may be mounted in a single chip package (such as a plastic carrier depicted in FIG. 1, with a lead (not shown) that is affixed to a motherboard or other higher level carrier) or in a multichip package (such as a ceramic substrate, semiconductor or laminate substrate that has either or both surface interconnections or buried interconnections). In any case, the semiconductor device is then integrated with other chips, discreet circuit elements, motherboard or (b) end product for an electronic assembly. The end product can be any product that includes semiconductor devices, ranging from toys and other low-end applications to advanced computer products having a display, a keyboard or other input device and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for an electronic assembly process comprising:
   receiving at least one electronic assembly after a solder reflow process using a Sn-containing solder and a water-soluble flux, wherein the at least one electronic assembly includes one or more of a flip chip module, a ball grid array module, a multichip module, and a printed circuit board assembly;
   baking the at least one electronic assembly in an oxygen containing environment after solder reflow and prior to an aqueous clean process, wherein the baking oxidizes one or more Sn(II) carboxylate flux residues to form one or more Sn(IV) carboxylate flux residues; and
   cleaning the at least one electronic assembly after solder reflow and after baking in the oxygen containing environment with the aqueous cleaning process, wherein oxidizing the one or more Sn(II) carboxylate flux residues prevents hydrolysis of the one or more Sn(II) carboxylate flux residues from forming one or more Sn-containing crystals during the aqueous cleaning process that are not removable by the aqueous cleaning process, and wherein the hydrolysis of the one or more Sn(IV) carboxylate flux residues forms one or more non-crystalline Sn(IV)hydroxides that dissolve in water during the aqueous cleaning process.

2. The method of claim 1, further comprising baking the at least one electronic assembly in the oxygen containing environment within a range of temperatures from 40° Celsius to 180° Celsius.

3. The method of claim 1, further comprising baking the at least one electronic assembly in the oxygen containing environment for at least one of 120° Celsius for thirty minutes and 60° Celsius for three hours.

4. The method of claim 1, further comprising baking the at least one electronic assembly for a range of temperatures from 60° Celsius to 120° Celsius for a corresponding range of bake times from thirty minutes to three hours.

5. The method of claim 1, further comprising baking the at least one electronic assembly in an oxygen containing environment for a time less than thirty minutes with a baking temperature more than 120° Celsius.

6. The method of claim 1, further comprising baking the at least one electronic assembly in an oxygen containing environment for a time more than one hundred and eighty minutes with a baking temperature less than 60° Celsius.

7. The method of claim 1, wherein the water-soluble flux is any suitable water-soluble flux used in an electronic packaging assembly.

8. The method of claim 1, further comprises the water-soluble flux including at least one or more of the following an activator, a solvent, a vehicle, and one or more additives.

9. The method of claim 1, wherein the at least one electronic assembly includes using the solder reflow process for interconnecting one or more flip chip semiconductor devices to a module substrate.

10. The method of claim 1, wherein the at least one electronic assembly includes using the solder reflow process for a BGA module assembly process.

11. The method of claim 1, wherein the at least one electronic assembly includes using the solder reflow process in a printed circuit board assembly.

12. The method of claim 1, wherein the solder reflow process further comprises forming a solder interconnection from one or more of a plated solder bump, a solder ball, a solder bump deposited by an evaporation process, and a solder paste.

13. The method of claim 1, wherein receiving the at least one electronic assembly after solder reflow process includes receiving at least one of a flip chip semiconductor device with a plurality of solder interconnections to module substrate, a BGA module, and an assembled printed circuit board.

14. The method of claim 1, wherein the at least one electronic assembly using the Sn-containing solder includes using at least one of a Sn—Pb solder, a lead-free solder, and other Sn-containing solder.

15. The method of claim 1, wherein the solder reflow process using the Sn-containing solder includes at least one of Sn—Ag based solders, Sn—Ag—Cu based solders, Sn—Zn based solders, and Sn—Sb based solders.

16. The method of claim 1, wherein baking the at least one electronic assembly in an oxygen containing environment after solder reflow and prior to an aqueous clean process, further comprises:
   one or more Sn-containing flux residues of the solder reflow process include one or more of Sn(II) carboxylate, R-(COO)$_2$Sn(II), Sn(IV) carboxylate, and R-(COO)$_4$Sn(IV); and
   preventing formation of one or more Sn-containing crystals during the aqueous cleaning process by hydrolysis of the one or more Sn(II) carboxylate flux residues by the baking, wherein the one or more Sn-containing crystals have a composition that is one of $[Sn_3(OH)_4]^{2+}$ or $Sn_6O_4(OH)_4$.

17. The method of claim 1, wherein hydrolysis of Sn(IV) carboxylate flux residue during the aqueous cleaning process does not yield insoluble crystals.

18. The method of claim 1, wherein receiving the at least one electronic assembly after a solder reflow process using a Sn-containing solder and a water-soluble flux further comprises:
   receiving the at least one electronic assembly that is a flip chip semiconductor module after the solder reflow process using the Sn-containing solder that is a lead-free solder and the water-soluble flux that is Indium® WS-3555.

* * * * *